(12) United States Patent
Ou et al.

(10) Patent No.: US 8,310,260 B2
(45) Date of Patent: Nov. 13, 2012

(54) CONNECTING DEVICE

(75) Inventors: Guang-Feng Ou, Shenzhen (CN); Yong-Zhao Huang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 248 days.

(21) Appl. No.: 12/813,528

(22) Filed: Jun. 11, 2010

(65) Prior Publication Data

US 2011/0241717 A1    Oct. 6, 2011

(30) Foreign Application Priority Data

Mar. 31, 2010  (CN) .......................... 2010 1 0137032

(51) Int. Cl.
  *G01R 31/00*    (2006.01)
(52) U.S. Cl. .......... 324/756.04; 324/756.05; 324/756.02
(58) Field of Classification Search ............ 324/757.01–757.05, 750.01–750.3, 324/754.01–754.3, 755.01–755.11, 762.01–762.1, 324/756.04–756.05; 257/48; 438/14–18; 439/482

See application file for complete search history.

(56) References Cited

U.S. PATENT DOCUMENTS

| 4,473,798 | A | * | 9/1984 | Cedrone et al. | .......... | 324/756.04 |
| 4,541,676 | A | * | 9/1985 | Hansen et al. | .................. | 439/68 |

* cited by examiner

*Primary Examiner* — Tung X Nguyen
(74) *Attorney, Agent, or Firm* — Altis Law Group, Inc.

(57) ABSTRACT

A connecting device for connecting pins of a DIP chip to a test device comprises two each of half frames, columns of testing pins, connecting screws, fixing screws, and four holding plates. The two columns of testing pins are arranged respectively on the two half frames parallel to the lengthways direction of the half frame. The distance between two adjacent testing pins in the same column is equal to that between the two adjacent pins in the same column of the DIP chip. The two connecting screws screw into the half frames perpendicular to the lengthways direction of the half frame. Two of the holding plates extend down from each of the half frames and are aligned with short sides of the corresponding half frame. The fixing screws fix the two holding plates on the same half frame along a direction parallel to the lengthways direction of the half frame.

7 Claims, 4 Drawing Sheets

CONNECTING DEVICE

BACKGROUND

1. Technical Field

The present disclosure relates to connecting devices, and particularly, to a connecting device for various types of dual in-lines package (DIP) chips.

2. Description of Related Art

DIP chips need to be subjected to tests. A connecting device is often required for connecting a DIP chip to a corresponding test device. However, conventional connecting devices are designed for connecting only one type of DIP chip. As such, different types of connecting devices are required in testing different types of DIP chips, which increases test costs.

Therefore, it is desirable to provide a connecting device which can overcome the above-mentioned limitations.

BRIEF DESCRIPTION OF THE DRAWINGS

Many aspects of the present connecting device should be better understood with reference to the following drawings. The components in the drawings are not necessarily drawn to scale, the emphasis instead being placed upon clearly illustrating the principles of the present connecting device. Moreover, in the drawings, like reference numerals designate corresponding parts throughout the several views.

DETAILED DESCRIPTION

Figure 1:
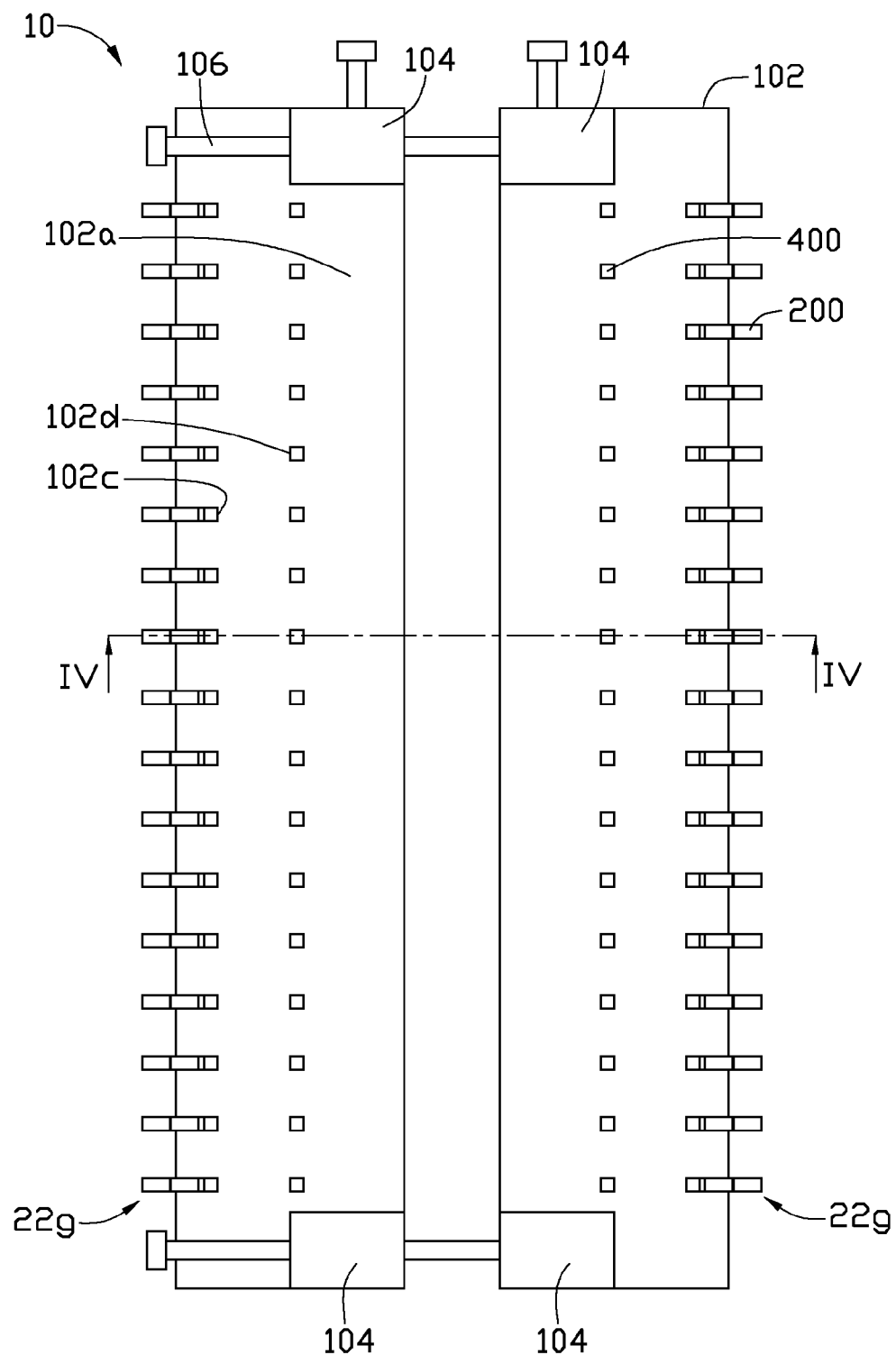
FIG. 1 is a top view of a connecting device, according to one embodiment.
Figure 2:
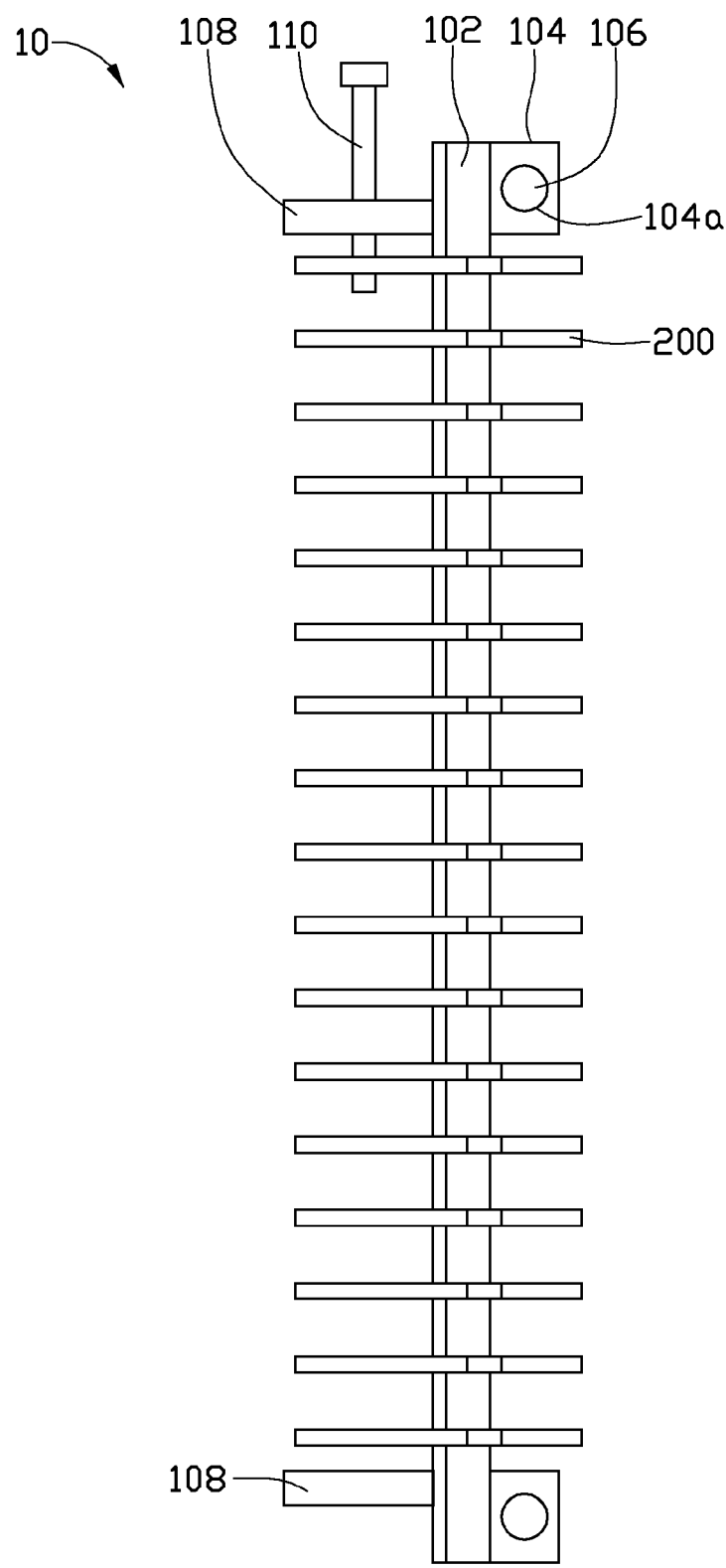
FIG. 2 is a side view of the connecting device of FIG. 1.
Figure 3:
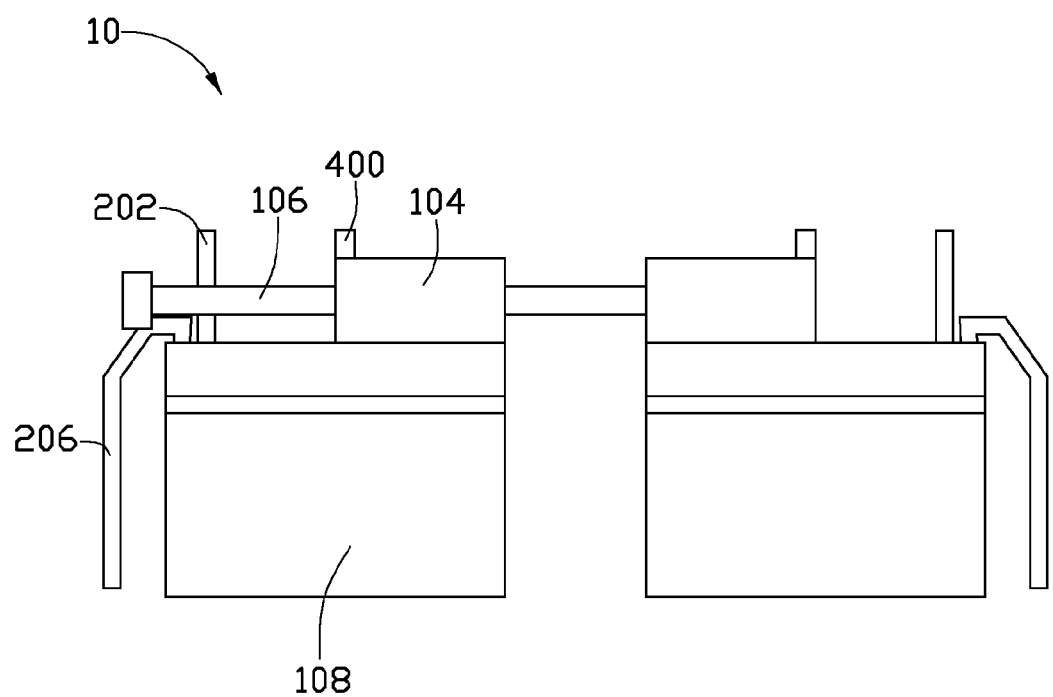
FIG. 3 is another side view of the connecting device of FIG. 1.

Embodiments of the present connecting device will now be described in detail with reference to the drawings.

Referring to FIGS. 1-4, a connecting device 10, according to an embodiment, is configured for connecting two columns of pins 22 of a DIP chip 20 to a test device (not shown) for testing the DIP chip 20. The connecting device 10 includes two rectangular half frames 102, four protrusions 104, two connecting screws 106, four holding plates 108, two fixing screws 110, and two columns of testing pins 200.

The two half frames 102 are arranged alongside and the lengthways direction thereof is parallel to each other. Each half frame 102 includes a top surface 102a and a bottom surface 102b opposite to the top surface 102a. A column of fixing grooves 102c are formed on the top surfaces 102a and are arranged parallel to the lengthways direction of the half frame 102. Each fixing groove 102c of each half frame 102 has inner side surfaces 102e substantially facing and inclining to the other half frame 102. The distance between two adjacent fixing grooves 102c in the same column is substantially equal to that of the two adjacent pins 22 in the same column of the DIP chip 20.

Each testing pin 200 is made of conductive material such as copper and includes a connecting end 202, a testing end 206, and a fixing part 204 connecting the connecting end 202 and the testing end 206. The fixing part 204 is fixedly held in the fixing groove 102c, resisting on the inner side surface 102e. The connecting end 202 extends upwards from the top surface 102a to the outside the fixing groove 102c. The testing end 206 extends downwards from the fixing part 204 beyond the bottom surface 102b.

Two of the four protrusions 104 protrude upwards from each top surface 102a and are positioned at two corners adjacent to the other half frame 102 respectively. Each protrusion 104 defines a screw hole 104a along a widthwise direction of the corresponding half frame 102. Each connecting screw 106 screws through the screw holes 104a of two adjacent protrusions 104 on the different half frames 102. As such, the distance between the two half frames 102 can be adjusted by adjusting the two connecting screws 106, and therefore DIP chips of different widths can be fittingly framed by the connecting device 10.

Two of the four holding plates 108 extend downwards from each bottom surface 102b and are aligned with two short sides of the corresponding half frame 102. Each fixing screw 110 screws through one of the two holding plates on the same half frame 102 along the lengthways direction of the half frame 102. As such, DIP chips with different lengths can be fittingly fixed by the connecting device 10 by adjusting the two fixing screws 110.

In operation, the two connecting screws 106 are adjusted so that the DIP chip 20 to be tested is framed by the connecting device 10 and the pins 22 of the DIP chip 20 are exactly contacted to the testing ends 206 respectively. Then, the two fixing screws 110 are adjusted so that the DIP chip 20 is fittingly fixed by the connection device 10. As such, probes of a test device (not shown) can be connected to the connecting end 202.

The configuration of the testing pin 200 is not limited to this embodiment. In other alternative embodiments, both the fixing parts 204 and the fixing grooves 102c can be omitted and the testing pins 200 can puncture through the half frames 102 directly instead. Of course, other fixing methods can be employed to fixing the testing pins to the half frames 102 too.

In other alternative embodiments, the four protrusions 104 can be omitted while the two connecting screws 106 directly screw into the two half frames 102 along the widthwise direction of the half frames 102.

Figure 4:
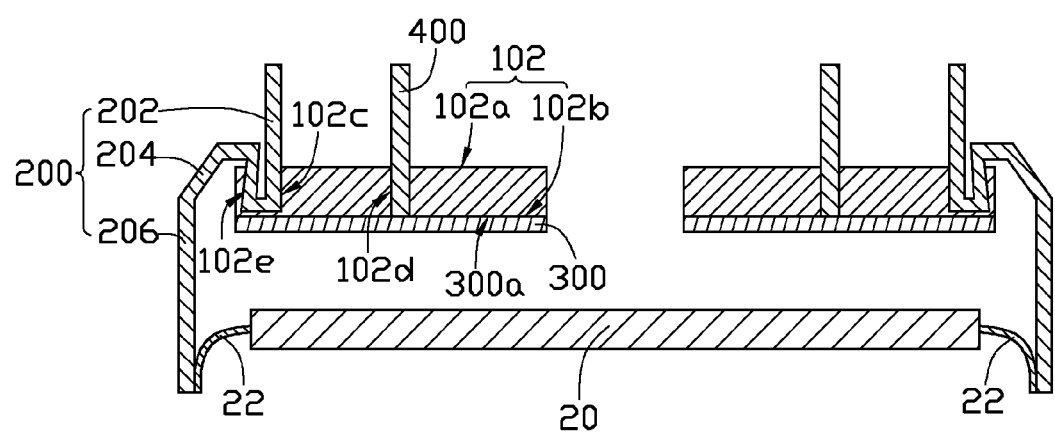
FIG. 4 is a cross-sectional view of the connecting device taken along a line IV-IV of FIG. 1.

Referring to FIG. 4, the connecting device 10 further includes two ground sheets 300 disposed beneath the two half frames 102 respectively and a number of ground terminals 400. Each ground sheet 300 includes a conductive layer 300a made of conductive material such as copper and is disposed on the corresponding the bottom surface 102b. Each half frame 102 defines a column of ground holes 102d therethrough, corresponding to the fixing grooves 102c. The ground terminals 400 extend upward from the conductive layer 300a and run through the ground holes 102d beyond the top surface 102a, respectively.

Generally, each column of DIP chip includes at least one ground pin, in the present embodiment, the pins 22g (referring to FIG. 1) at the left bottom and the right bottom of the DIP chip 20 are ground pins. The two fixing grooves 102c in the left bottom and the right bottom of fixing frame 100 communicate to the bottom surface 102b. As such, the testing pins 200 corresponding to the two fixing grooves 102c in the left bottom and the right bottom of fixing frame 100 can extend to connect to the two conductive layers 300a respectively.

As such, in operation, the two conductive layers 300a are connected respectively to the ground pins 22g of the DIP chip 20, which further enables the ground terminals 400 to connect to the ground pins 22g. Then, probes of a test device (not shown) are connected to a testing pin 200 and a corresponding adjacent ground terminal 400. Distortion caused by different distances between the pin 22 being tested and the pin 22g at the left bottom or the right bottom of the DIP chip 20 can be averaged. As such, the testing accuracy is improved.

It will be understood that the above particular embodiments is shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A connecting device used for connecting two columns of pins of a DIP chip to a test device, the connecting device comprising:
   two half frames arranged movably relative to each other;
   two columns of testing pins each arranged respectively on the two half frames, and parallel to each other; the distance between two adjacent testing pins in the same column is equal to that between the two adjacent pins in the same column of the DIP chip;
   two connecting screws each screwing into the two half frames along a first direction perpendicular to the extending direction of the columns of the testing pins;
   four holding plates, wherein two of the four holding plates extend downwards from each of the half frame;
   two fixing screws each screwing through one of the two holding plates on the same half frame along a second direction parallel to the first direction.

2. The connecting device of claim 1, wherein each of the half frames includes a top surface and a bottom surface opposite to the top surface; each of the testing pins includes a connecting end extending upwards out of the top surface and a testing end extending downwards out of the bottom surface.

3. The connecting device of claim 2, wherein the holding plates are arranged perpendicularly extending from the bottom surface.

4. The connecting device of claim 2, further comprising four protrusions, wherein two of the four protrusions protrude upwards from each top surface and are positioned at two corners adjacent to the other half frame respectively; each of the protrusions defines a screw hole extending along the first direction, each connecting screw screws through the screw holes of two adjacent protrusions on different half frames.

5. The connecting device of claim 2, wherein a column of fixing grooves is formed on the top surface of each half frame, and arranged parallel to corresponding to the column of the testing pins of the frame; each of the column of the testing pins is mounted in a corresponding fixing groove.

6. The connecting device of claim 5, wherein each fixing groove has an inner side surface substantially facing and inclining to the other half frame.

7. The connecting device of claim 5, further comprising two ground sheets mounted respectively beneath the two bottom surfaces and a number of ground terminals, wherein each of the ground sheets comprise a conductive layer clinging to the bottom surface and connected to a ground pin of the DIP chip; each of the two half frames defines a column of ground holes therethrough corresponding to each of the fixing grooves of the half frame; the ground terminals are mounted respectively in the ground holes with one end thereof connects the conductive layer and the other end thereof extends out of the top surface.

* * * * *